(12) United States Patent
Kim

(10) Patent No.: US 7,682,957 B2
(45) Date of Patent: Mar. 23, 2010

(54) METHOD OF FORMING PAD AND FUSE IN SEMICONDUCTOR DEVICE

(75) Inventor: Yeong Sil Kim, Gyeonggi-do (KR)

(73) Assignee: Dongbu Electronics Co., Ltd., Seoul (KR)

( * ) Notice: Subject to any disclaimer, the term of this patent is extended or adjusted under 35 U.S.C. 154(b) by 528 days.

(21) Appl. No.: 11/319,616

(22) Filed: Dec. 29, 2005

(65) Prior Publication Data

US 2006/0141759 A1 Jun. 29, 2006

(30) Foreign Application Priority Data

Dec. 29, 2004 (KR) .................. 10-2004-0115544

(51) Int. Cl.
*H01L 21/44* (2006.01)
(52) U.S. Cl. .................. 438/601; 257/E21.592
(58) Field of Classification Search ........... 438/601, 438/132, 215, 281, 467, 612, FOR. 433; 257/E23.15, E23.02, E21.592, 209
See application file for complete search history.

(56) References Cited

U.S. PATENT DOCUMENTS

| | | | | |
|---|---|---|---|---|
| 6,180,503 B1 * | 1/2001 | Tzeng et al. | ................ | 438/601 |
| 6,440,833 B1 * | 8/2002 | Lee et al. | .................. | 438/601 |
| 6,656,826 B2 * | 12/2003 | Ishimaru | ................... | 438/612 |
| 6,677,226 B1 * | 1/2004 | Bowen et al. | ............... | 438/601 |
| 7,301,216 B2 * | 11/2007 | Lee et al. | .................... | 257/529 |
| 7,323,760 B2 * | 1/2008 | Sakoh | ......................... | 257/529 |
| 2002/0079552 A1 * | 6/2002 | Koike | ........................ | 257/529 |
| 2004/0014260 A1 * | 1/2004 | Wu et al. | .................... | 438/132 |
| 2004/0171263 A1 * | 9/2004 | Choi et al. | ................. | 438/691 |
| 2005/0142834 A1 * | 6/2005 | Lee | ............................ | 438/601 |
| 2005/0179062 A1 * | 8/2005 | Kajita | ........................ | 257/209 |
| 2006/0017153 A1 * | 1/2006 | Choi | ........................... | 257/700 |
| 2006/0141759 A1 * | 6/2006 | Kim | ........................... | 438/601 |

\* cited by examiner

*Primary Examiner*—W. David Coleman
*Assistant Examiner*—Latanya Crawford
(74) *Attorney, Agent, or Firm*—Lowe Hauptman Ham & Berner, LLP

(57) ABSTRACT

A method of forming a pad and a fuse in a semiconductor device. A copper layer located in both a fuse region and a pad region is formed in a dielectric layer. A first insulating layer is formed on the dielectric layer to cover the copper layer and selectively etched to expose the copper layer in the fuse region. An aluminum fuse is formed on the first insulating layer in the fuse region and connected to the exposed copper layer. A second insulating layer is formed on both the aluminum fuse and the first insulating layer and selectively etched together with the first insulating layer to expose the underlying copper layer in the pad region. An aluminum pad is formed on the second insulating layer in the pad region and connected to the exposed copper layer in the pad region. At least one third insulating layer is formed on both the aluminum pad and the second insulating layer and selectively etched to expose the aluminum pad only.

10 Claims, 3 Drawing Sheets

METHOD OF FORMING PAD AND FUSE IN SEMICONDUCTOR DEVICE

CROSS REFERENCE TO RELATED APPLICATIONS

This U.S. non-provisional application claims priority under 35 U.S.C. §119 from Korean Patent Application No. 2004-115544, which was filed in the Korean Intellectual Property Office on Dec. 29, 2004, the contents of which are incorporated by reference herein in its entirety.

BACKGROUND OF THE INVENTION

1. Field of the Invention

The present invention relates generally to semiconductor integrated circuit (IC) fabrication technology and, more particularly, to a method of forming a pad and a fuse in a semiconductor IC device.

2. Description of the Related Art

Semiconductor IC devices have metal pads, also referred to as bonding pads, etc., formed underneath and exposed to their exterior surfaces. The metal pads allow electrical access to and from internal device circuitry. In addition, most semiconductor IC devices, such as memory chips, have metal fuses formed underneath and exposed to their exterior surfaces. When there is a defect cell in the device, the metal fuses are used to replace the defect cell by using a spare cell.

FIGS. 1A and 1B show, in cross-sectional views, a conventional method of forming a pad and a fuse in a semiconductor device.

Referring to FIG. 1A, a copper layer 10 is formed in a dielectric layer 11 and connected to an underlying layer 12 such as metal lines. The copper layer 10 is covered with an insulating layer 13 in a fuse region 14 and exposed in a pad region 15. An aluminum pad 16 is formed on and connected to the exposed copper layer 10 in the pad region 15. Then, a passivation layer 17 is deposited on both the insulating layer 13 and the aluminum pad 16.

Referring to FIG. 1B, a suitable photoresist pattern 18 is formed on the passivation layer 17 and used as an etch mask for opening the aluminum pad 16. That is, in order to open the aluminum pad 16, the passivation layer 17 on the aluminum pad 16 is etched through the photoresist pattern 18.

The passivation layer 17 is traditionally made of silicon nitride, which may cause unfavorably scattered reflection of a laser beam when laser cutting is performed to the copper layer 10 in the fuse region 14. Therefore, a part of the passivation layer 17 in the fuse region 14 should be also etched to leave only the insulating layer 13 made of silicon oxide.

In the pad region 15, the passivation layer 17 is typically over-etched to obtain a reliable process margin. For example, when the passivation layer 17 is etched to a first thickness T1 in the pad region 15, the aluminum pad 16 is also partially etched to a second thickness T2. During such over-etching process, in the fuse region 14 both the passivation layer 17 and the insulating layer 13 are often etched together to a third thickness T3.

As a result, the copper layer 10 in the fuse region 14 may be exposed to the outside. In general, copper is very susceptible to contamination and may act as a pollution source due to high diffusible property. So the exposed copper layer 10 may become causes of drops in yield and reliability of the devices.

SUMMARY OF THE INVENTION

Exemplary, non-limiting embodiments of the present invention provide a method of forming a pad and a fuse in a semiconductor device so as to prevent a copper layer for the fuse from being exposed during a pad opening process.

According to one exemplary embodiment of the present invention, the method comprises forming a copper layer in a dielectric layer, the copper layer being located in both a fuse region and a pad region, forming a first insulating layer on the dielectric layer to cover the copper layer, selectively etching the first insulating layer to expose the copper layer in the fuse region, forming an aluminum fuse on the first insulating layer in the fuse region, the aluminum fuse being connected to the exposed copper layer, forming a second insulating layer on both the aluminum fuse and the first insulating layer, selectively etching the first and second insulating layers to expose the underlying copper layer in the pad region, forming an aluminum pad on the second insulating layer in the pad region, the aluminum pad being connected to the exposed copper layer in the pad region, forming at least one third insulating layer on both the aluminum pad and the second insulating layer, and selectively etching the third insulating layer to expose the aluminum pad only.

In the method, the third insulating layer can include a third, a fourth and a fifth insulating layers, which can be made of silicon nitride, silicon oxide and silicon nitride, respectively. Here the etching of the fourth insulating layer can use an etchant gas with a high selectivity of oxide-to-nitride.

In the method, the copper layer can have a disconnected separate pattern in the fuse region. Furthermore, the second insulating layer can be eight to ten times as thick as the third insulating layer. For example, the thickness of the second insulating layer is 700~1000 Å.

DETAILED DESCRIPTION OF EXEMPLARY EMBODIMENTS OF THE INVENTION

An exemplary, non-limiting embodiment of the present invention will now be described more fully hereinafter with reference to the accompanying drawings. This invention may, however, be embodied in many different forms and should not be construed as limited to the exemplary embodiment set forth herein. Rather, the disclosed embodiment is provided so that this disclosure will be thorough and complete, and will fully convey the disclosure of the invention to those skilled in the art. The principles and features of this invention may be employed in varied and numerous embodiments without departing from the scope of the invention.

In is noted that well-known structures and processes are not described or illustrated in detail to avoid obscuring the essence of the present invention. It is also noted that the figures are not drawn to scale. Rather, for simplicity and clarity of illustration, the dimensions of some of the elements are exaggerated relative to other elements.

FIGS. 2A to 2D are cross-sectional views showing a method of forming a pad and a fuse in a semiconductor device in accordance with an exemplary embodiment of the present invention.

Figure 1A:
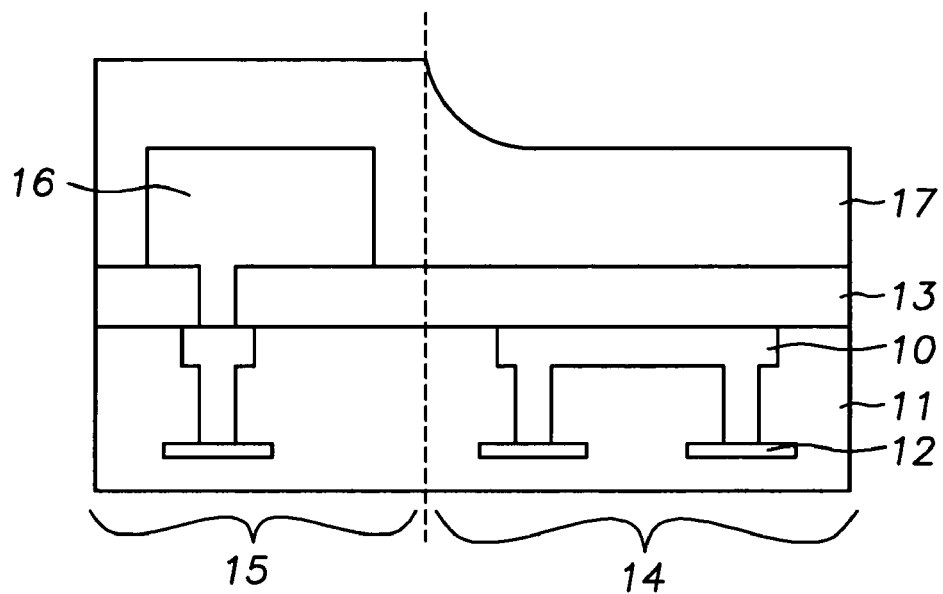
FIGS. 1A and 1B are cross-sectional views showing a conventional method of forming a pad and a fuse in a semiconductor device.
Figure 1B:
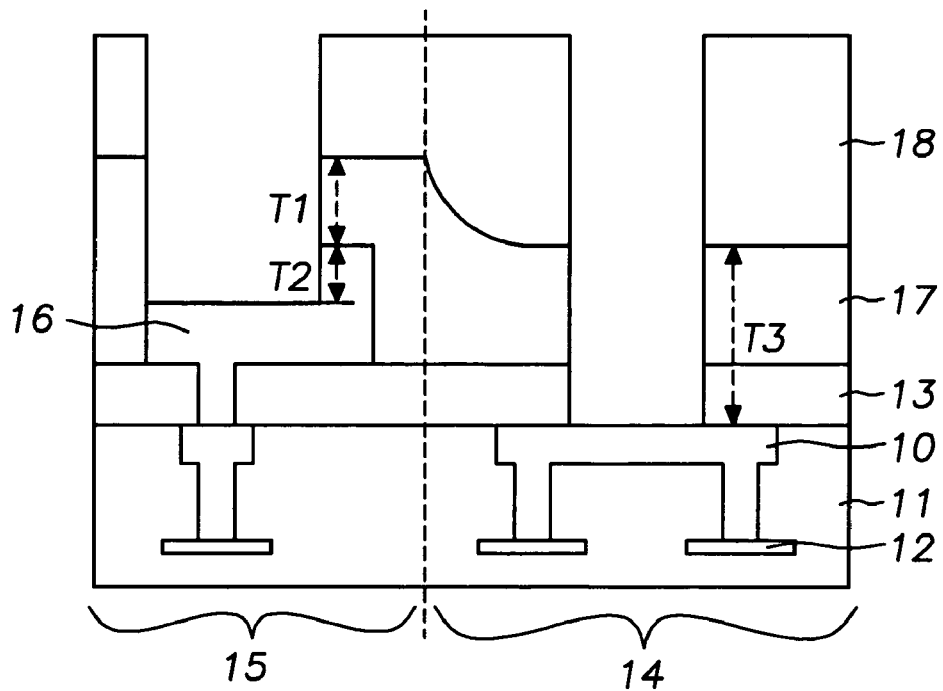
Figure 2A:
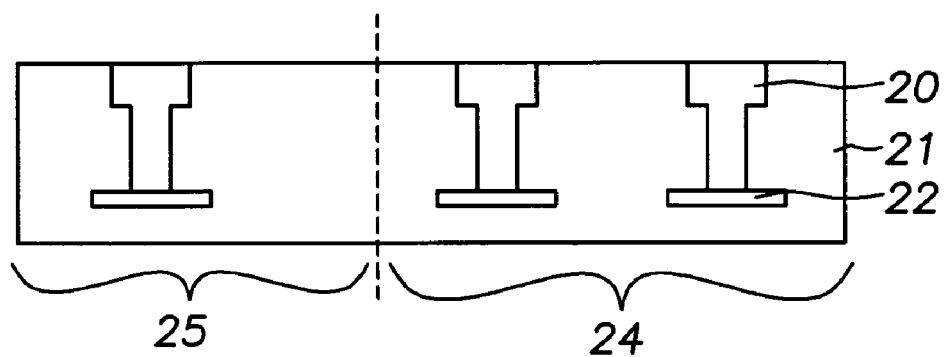
FIGS. 2A to 2D are cross-sectional views showing a method of forming a pad and a fuse in a semiconductor device in accordance with an exemplary embodiment of the present invention.

Referring to FIG. 2A, a copper layer 20 is formed in a dielectric layer 21 by using damascene technique, for example. The copper layer 20 is connected to an underlying layer 22 such as metal lines or other suitable structures earlier provided on a semiconductor substrate. The copper layer 20 is located in both a fuse region 24 and a pad region 25. In the fuse region 24, the copper layer 20 can have a disconnected separate pattern rather than a connected pattern as in the aforementioned conventional copper layer.

Figure 2B:
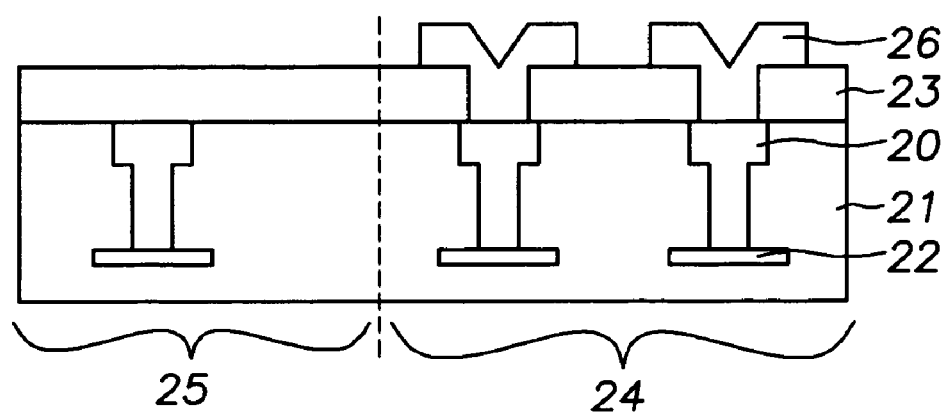

Next, as shown in FIG. 2B, a first insulating layer 23 is formed on the dielectric layer 21, covering the copper layer 20. Then the first insulating layer 23 is selectively etched by using typical photolithographic and etching process to expose the copper layer 20 in the fuse region 24. A first aluminum layer is deposited on the first insulating layer 23 and connected to the exposed copper layer 20 in the fuse region 24. The first aluminum layer is then selectively etched by using typical photolithographic and etching process, thus forming an aluminum fuse 26. Here, the first aluminum layer is fully removed from the pad region 25.

The aluminum fuse 26 of the present invention is relatively resistant to contamination and has poor diffusible properties in comparison with the conventional copper fuse. Therefore, even though the aluminum fuse 26 is exposed to the outside, the aluminum fuse 26 does not affect yield and reliability of the devices. Moreover, the aluminum fuse 26 is seldom exposed due to subsequent etching process of the invention, which will be discussed later.

Figure 2C:
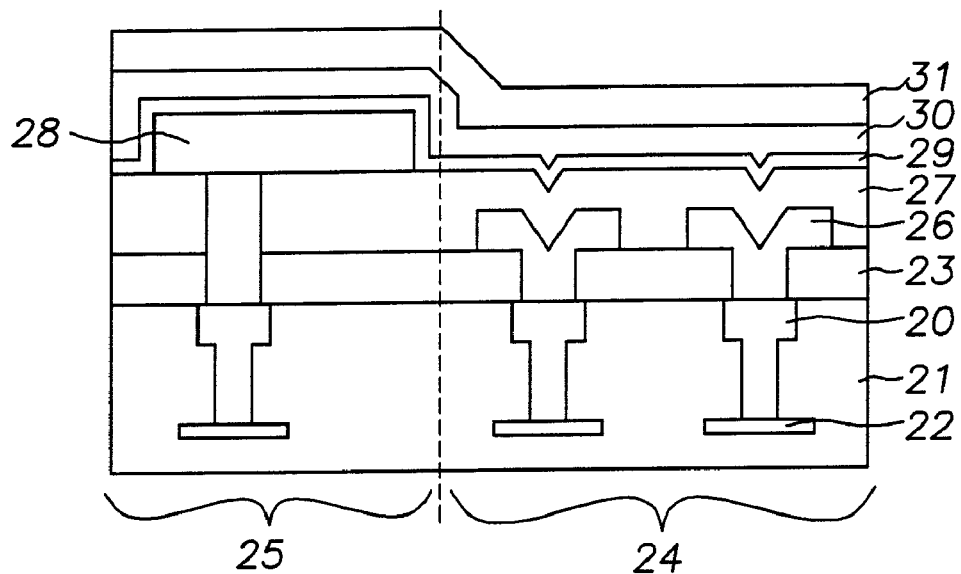

Next, as shown in FIG. 2C, a second insulating layer 27 is formed on both the aluminum fuse 26 and the first insulating layer 23. Then the first and second insulating layers 23 and 27 are selectively etched to expose the underlying copper layer 20 in the pad region 25. Further, a second aluminum layer is deposited and selectively etched to form an aluminum pad 28 electrically connected to the exposed copper layer 20 in the pad region 25. Third, fourth and fifth insulating layers 29-31 are then sequentially formed on the aluminum pad 28 and the second insulating layer 27. Preferably, the third, fourth and fifth insulating layers 29-31 are made of silicon nitride, silicon oxide and silicon nitride, respectively.

Figure 2D:
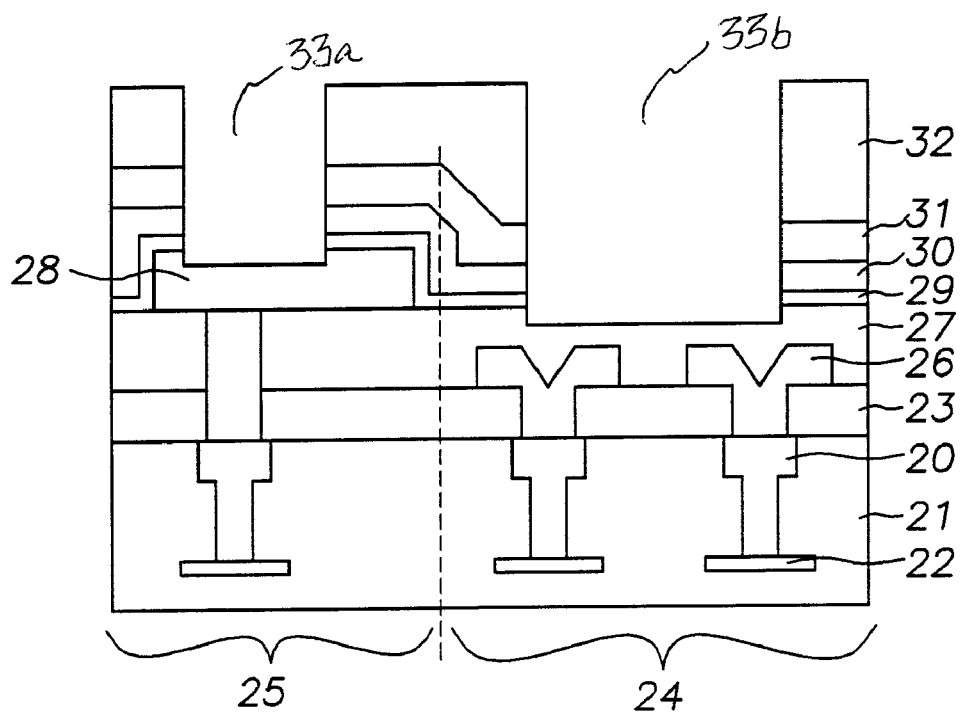

Next, as shown in FIG. 2D, formed on the fifth insulating layer 31 is a photoresist pattern 32 that defines a pad opening 33a and a fuse opening 33b. By using the photoresist pattern 32 as an etch mask, the fifth, fourth and third insulating layers 31-29 are selectively etched in sequence to form the pad opening 33a and the fuse opening 33b. Particularly, this etching process allows exposing the aluminum pad 28 through the pad opening 33a, but not exposing the aluminum fuse 26 in the fuse opening 33b.

In the above etching process, etching of the fourth insulating layer 30 can use carbon fluoride (CF) as an etchant gas, which has a high selectivity of oxide-to-nitride, for example, 20:1. Hence the third insulating layer 29 protects the second insulating layer 27 above the aluminum fuse 26 while the fourth insulating layer 30 is fully etched. In addition, the second insulating layer 27 has a thickness enough to remain when the third insulating layer 29 is over-etched. The second insulating layer 27 can be eight to ten times as thick as the third insulating layer 29. Preferably, the thickness of the second insulating layer 27 is 700~1000 Å.

While this invention has been particularly shown and described with reference to an exemplary embodiment thereof, it will be understood by those skilled in the art that various changes in form and details may be made therein without departing from the spirit and scope of the invention as defined by the appended claims.

What is claimed is:

1. A method of forming a pad and a fuse in a semiconductor device, the method comprising:

forming first, second and third copper layers in a dielectric layer, the first copper layer being located in a pad region, the second and third copper layers being located in a fuse region, wherein the first, second and third copper layers are respectively connected to metal lines provided on a semiconductor substrate;

forming a first insulating layer on the dielectric layer to cover the copper layers;

selectively etching the first insulating layer to expose the second and third copper layers in the fuse region;

forming a fuse pattern including first and second aluminum fuses on the first insulating layer in the fuse region, wherein the first aluminum fuse is connected to the exposed second copper layer, the second aluminum fuse is connected to the exposed third copper layer, and the first and second aluminum fuses are disconnected from each other mutually;

forming a second insulating layer on the first and second aluminum fuses and the first insulating layer;

selectively etching the first and second insulating layers to expose the underlying first copper layer in the pad region;

forming an aluminum pad on the second insulating layer in the pad region, the aluminum pad being connected to the exposed first copper layer in the pad region;

forming at least one third insulating layer on both the aluminum pad and the second insulating layer;

forming a photoresist pattern on the third insulating layer, the photoresist pattern being formed to define a pad opening in the pad region and a fuse opening in the fuse region; and forming the pad and fuse openings by selectively etching the third insulating layer using the photoresist pattern, wherein the aluminum pad is exposed through the pad opening; and the first and second aluminum fuses are unexposed through the fuse opening.

2. The method of claim 1, wherein the third insulating layer includes a third insulating layer, a fourth insulating layer and a fifth insulating layer.

3. The method of claim 1, wherein the second and third copper layers respectively comprise disconnected separate patterns in the fuse region.

4. The method of claim 1, wherein the second insulating layer is eight to ten times as thick as the third insulating layer.

5. The method of claim 1, wherein the thickness of the second insulating layer is 700~1000 Å.

6. The method of claim 1, wherein an upper surface of the aluminum pad on the first copper layer in the pad region and an upper surface of the first and second aluminum fuses on the second and third copper layers in the fuse region are on different horizontal planes.

7. The method of claim 1, wherein the pad opening and the fuse opening are formed simultaneously.

8. The method of claim 1, wherein the step of forming the aluminum pad is performed after the step of forming the first and second aluminum fuses.

9. The method of claim 2, wherein the third, the fourth and the fifth insulating layers are made of silicon nitride, silicon oxide and silicon nitride, respectively.

10. The method of claim 9, wherein the etching of the fourth insulating layer use an etchant gas with a high selectivity of oxide-to-nitride.

* * * * *